(12) United States Patent
Kim

(10) Patent No.: US 11,355,180 B2
(45) Date of Patent: Jun. 7, 2022

(54) SEMICONDUCTOR DEVICES AND SEMICONDUCTOR SYSTEMS INCLUDING THE SAME

(71) Applicant: SK hynix Inc., Icheon-si (KR)

(72) Inventor: Min O Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 65 days.

(21) Appl. No.: 16/451,163

(22) Filed: Jun. 25, 2019

(65) Prior Publication Data
US 2020/0185025 A1   Jun. 11, 2020

(30) Foreign Application Priority Data

Dec. 11, 2018 (KR) .................. 10-2018-0159102

(51) Int. Cl.
*G06F 3/06* (2006.01)
*G11C 11/4096* (2006.01)
*G11C 11/4076* (2006.01)

(52) U.S. Cl.
CPC ........ *G11C 11/4096* (2013.01); *G06F 3/0604* (2013.01); *G06F 3/0659* (2013.01); *G06F 3/0673* (2013.01); *G11C 11/4076* (2013.01)

(58) Field of Classification Search
CPC ............ G11C 11/4096; G11C 11/4076; G11C 2207/107; G11C 7/1039; G11C 7/22; G11C 8/18; G11C 11/408; G11C 11/409; G06F 3/0659; G06F 3/0604
See application file for complete search history.

(56) References Cited

U.S. PATENT DOCUMENTS

2017/0255394 A1* 9/2017 Suh .................. G06F 12/06

OTHER PUBLICATIONS

Korean Application No. 10-2018-0082453, Jul. 16, 2018," Semiconductor Device", SK hynix Inc.

* cited by examiner

*Primary Examiner* — David Yi
*Assistant Examiner* — Dustin B. Fulford
(74) *Attorney, Agent, or Firm* — William Park & Associates Ltd.

(57) ABSTRACT

A semiconductor system includes a first semiconductor device and a second semiconductor device. The first semiconductor device outputs a chip selection signal, a command signal, and data. The second semiconductor device generates internal data from the data, stores the internal data, and stores the data as pattern data when the chip selection signal is enabled and a write operation is performed according to a logic level combination of the command signal. In addition, the second semiconductor device generates the internal data from the pattern data and stores the internal data without receiving the data when the chip selection signal is enabled and a write copy operation is performed according to a logic level combination of the command signal.

28 Claims, 12 Drawing Sheets

FIG. 3

|  | CLK | CS | CMD<1> | CMD<2> | CMD<3> | CMD<4> | CMD<5> | CMD<6> | CMD<7> |
|---|---|---|---|---|---|---|---|---|---|
| WT | Rising | H | L | H | H | X | X | X | X |
| WT_CF | Rising | H | L | L | H | H | L | L | L |
|  | Falling | X | L | L | L | L | H | H | L |
| WT_CP | Rising | H | L | L | H | H | L | L | L |
|  | Falling | X | L | L | L | L | H | H | H |

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C. 119(a) to Korean Application No. 10-2018-0159102, filed on Dec. 11, 2018, which is incorporated herein by reference in its entirety.

BACKGROUND

1. Technical Field

Embodiments of the present disclosure relate to semiconductor devices and semiconductor systems including semiconductor devices, and more particularly, to semiconductor devices performing a write copy operation and semiconductor systems including such semiconductor devices.

2. Related Art

In general, semiconductor devices, such as dynamic random access memory (DRAM) devices, may include a plurality of bank groups including cell arrays which are selected by addresses. Each of the bank groups may include a plurality of banks. The semiconductor device may select any one of the plurality of bank groups and may perform a column operation for outputting data stored in a cell array included in the selected bank group through input/output (I/O) lines.

SUMMARY

According to an embodiment, a semiconductor system includes a first semiconductor device and a second semiconductor device. The first semiconductor device outputs a chip selection signal, a command signal, and data. The second semiconductor device generates internal data from the data, stores the internal data, and stores the data as pattern data when the chip selection signal is enabled and a write operation is performed according to a logic level combination of the command signal. In addition, the second semiconductor device generates the internal data from the pattern data and stores the internal data without receiving the data when the chip selection signal is enabled and a write copy operation is performed according to a logic level combination of the command signal.

According to another embodiment, a semiconductor system includes a first semiconductor device and a second semiconductor device. The first semiconductor device outputs a chip selection signal, a command signal, first data, and second data. The second semiconductor device includes a core region and a pipe circuit. The second semiconductor device generates first and second internal data and first and second pattern data from the first and second data, stores the first and second internal data in the core region after the first and second internal data and the first and second pattern data are generated, and stores the first and second pattern data in the pipe circuit when the chip selection signal is enabled and a write operation is performed according to a logic level combination of the command signal. In addition, the second semiconductor device generates the first and second internal data from the first and second pattern data and stores the first and second internal data in the core region when the chip selection signal is enabled and a write copy operation is performed according to a logic level combination of the command signal.

According to yet another embodiment, a semiconductor device includes a first data processing circuit, a second data processing circuit, and a core region. The first data processing circuit generates first internal data from first data and stores the first data as first pattern data, during a write operation according to a logic level combination of a chip selection signal and a command signal. Moreover, the first data processing circuit generates the first internal data from the first pattern data during a write copy operation according to a logic level combination of the chip selection signal and the command signal. The second data processing circuit generates second internal data from second data and stores the second data as second pattern data during the write operation, and the second data processing circuit generates the second internal data from the second pattern data during the write copy operation. The core region stores the first and second internal data according to an address signal.

BRIEF DESCRIPTION OF THE DRAWINGS

FIG. 3 is a table illustrating an operation of a command decoder included in the first data processing circuit of FIG. 2.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

In the present disclosure, semiconductor devices may provide a bank group mode, an 8-bank mode, and a 16-bank mode. A bank group may include a plurality of banks. For example, a bank group may include four banks. In the bank group mode, a column operation for one bank included in the bank group may be performed by one command. In the 8-bank mode, column operations for two banks respectively included in separate bank groups are sequentially performed by one command. In the 16-bank mode, column operations for four banks respectively included in separate bank groups are sequentially performed by one command.

Figure 1:
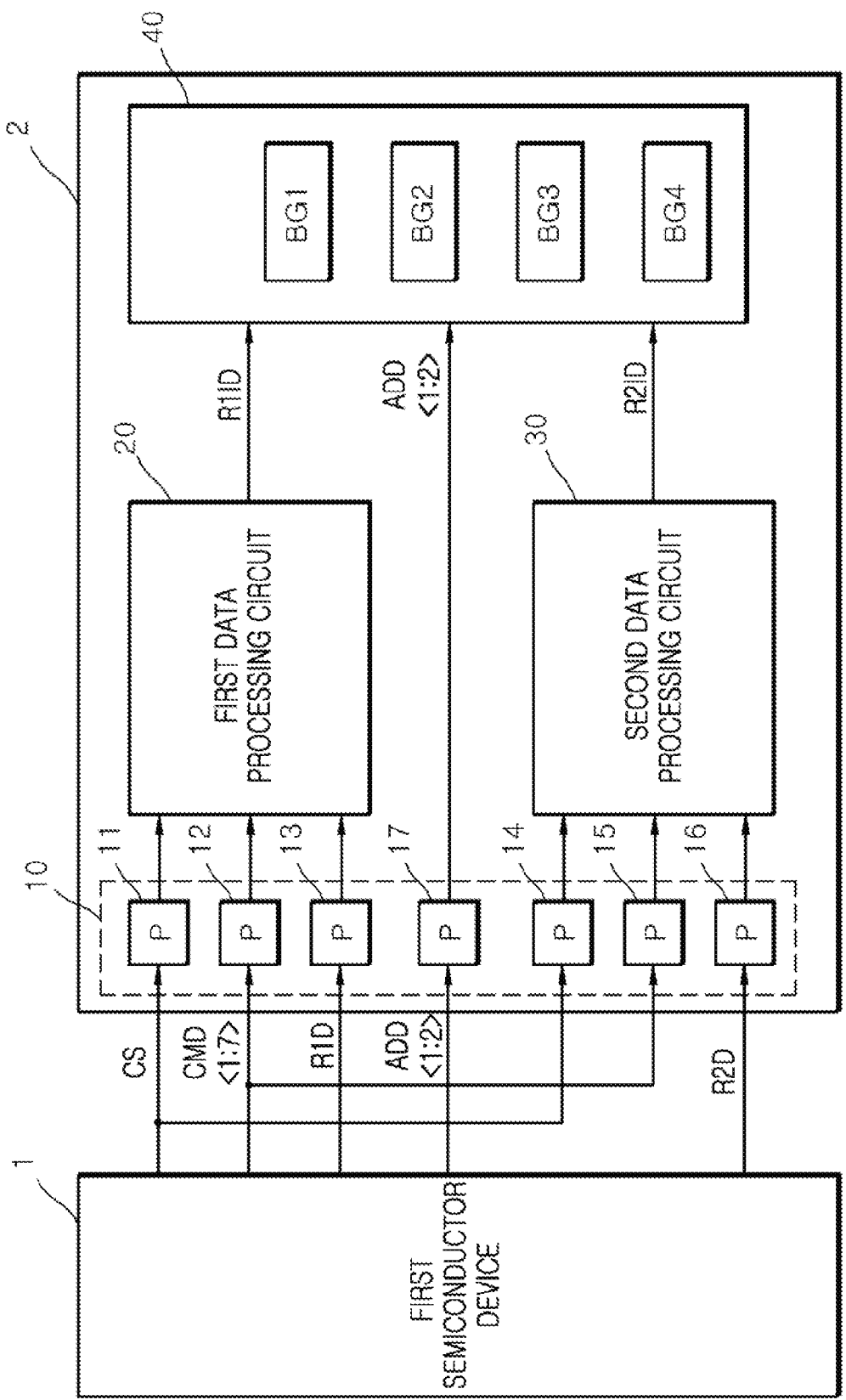
FIG. 1 is a block diagram illustrating a configuration of a semiconductor system, according to an embodiment of the present disclosure.

As illustrated in FIG. 1, a semiconductor system, according to an embodiment, may include a first semiconductor device 1 and a second semiconductor device 2.

The first semiconductor device 1 may output a chip selection signal CS, first to seventh command signals CMD<1:7>, first data R1D, first and second address signals ADD<1:2>, and second data R2D to the second semiconductor device 2. The number of bits included in the command signals and the number of bits included in the address signals may be set to be different according to the embodiments. Although each of the first and second data R1D and R2D is illustrated as one signal line, the each of the first and second data R1D and R2D may be set to include a plurality of bits. For example, each of the first and second data R1D and R2D may be set to include eight bits, sixteen bits or thirty-two bits according to the embodiments.

The second semiconductor device 2 may include a pad region 10, a first data processing circuit 20, a second data processing circuit 30, and a core region 40.

The pad region 10 may include a first pad 11, a second pad 12, a third pad 13, a fourth pad 14, a fifth pad 15, a sixth pad 16, and a seventh pad 17.

The chip selection signal CS outputted from the first semiconductor device 1 may be inputted to the first data processing circuit 20 through the first pad 11.

The first to seventh command signals CMD<1:7> outputted from the first semiconductor device 1 may be inputted to the first data processing circuit 20 through the second pad 12.

The first data R1D outputted from the first semiconductor device 1 may be inputted to the first data processing circuit 20 through the third pad 13.

The chip selection signal CS outputted from the first semiconductor device 1 may be inputted to the second data processing circuit 30 through the fourth pad 14.

The first to seventh command signals CMD<1:7> outputted from the first semiconductor device 1 may be inputted to the second data processing circuit 30 through the fifth pad 15.

The second data R2D outputted from the first semiconductor device 1 may be inputted to the second data processing circuit 30 through the sixth pad 16.

The first and second address signals ADD<1:2> outputted from the first semiconductor device 1 may be inputted to the core region 40 through the seventh pad 17.

Although FIG. 1 illustrates an example in which the pad region 10 includes the first to seventh pads 11-17, the number of pads included in the pad region 10 may be set to be different according to the embodiments.

The first data processing circuit 20 may generate first internal data R1ID from the first data R1D during a write operation, according to a logic level combination of the chip selection signal CS and the first to seventh command signals CMD<1:7>. The first data processing circuit 20 may store the first data R1D as first pattern data (PD1 of FIG. 9) during the write operation, according to a logic level combination of the chip selection signal CS and the first to seventh command signals CMD<1:7>. The first data processing circuit 20 may generate the first internal data R1ID from the first pattern data (PD1 of FIG. 9) during a write copy operation, according to a logic level combination of the chip selection signal CS and the first to seventh command signals CMD<1:7>. The write copy operation may be set as an operation that stores the first data R1D inputted during the write operation in a pipe circuit (24 of FIG. 2) as the first pattern data (PD1 of FIG. 9) and generates the first internal data R1ID from the first pattern data (PD1 of FIG. 9) to store the first internal data R1ID in the core region 40.

The second data processing circuit 30 may generate second internal data R2ID from the second data R2D during the write operation, according to a logic level combination of the chip selection signal CS and the first to seventh command signals CMD<1:7>. The second data processing circuit 30 may store the second data R2D as second pattern data (not shown) during the write operation, according to a logic level combination of the chip selection signal CS and the first to seventh command signals CMD<1:7>. The second data processing circuit 30 may generate the second internal data R2ID from the second pattern data (not shown) during the write copy operation, according to a logic level combination of the chip selection signal CS and the first to seventh command signals CMD<1:7>.

The core region 40 may include a first bank group BG1, a second bank group BG2, a third bank group BG3, and a fourth bank group BG4. The core region 40 may store the first internal data R1ID and the second internal data R2ID in the first bank group BG1, the second bank group BG2, the third bank group BG3, or the fourth bank group BG4, which is selected according to the first and second address signals ADD<1:2>.

The first bank group BG1 may perform a column operation to store the first internal data R1ID and the second internal data R2ID in memory cells of a bank (not shown) which is selected during the write operation and the write copy operation.

The second bank group BG2 may perform the column operation to store the first internal data R1ID and the second internal data R2ID in memory cells of a bank (not shown) which is selected during the write operation and the write copy operation.

The third bank group BG3 may perform the column operation to store the first internal data R1ID and the second internal data R2ID in memory cells of a bank (not shown) which is selected during the write operation and the write copy operation.

The fourth bank group BG4 may perform the column operation to store the first internal data R1ID and the second internal data R2ID in memory cells of a bank (not shown) which is selected during the write operation and the write copy operation.

The first to fourth bank groups BG1, BG2, BG3, and BG4 may perform a read operation in addition to the write operation. That is, each of the first to fourth bank groups BG1, BG2, BG3, and BG4 may output the first internal data R1ID and the second internal data R2ID stored therein during the read operation.

The second semiconductor device 2 having the above-described configuration may generate the first internal data R1ID and the first pattern data (PD1 of FIG. 9) from the first data R1D to store the first internal data R1ID in the core region 40, during the write operation according to a logic level combination of the first to seventh command signals CMD<1:7> while the chip selection signal CS is enabled. The second semiconductor device 2 may generate the first internal data R1ID from the first pattern data (PD1 of FIG.

9) to store the first internal data R1ID in the core region 40, during the write copy operation according to a logic level combination of the first to seventh command signals CMD<1:7> while the chip selection signal CS is enabled. The second semiconductor device 2 may generate the second internal data R2ID and the second pattern data (not shown) from the second data R2D to store the second internal data R2ID in the core region 40, during the write operation according to a logic level combination of the first to seventh command signals CMD<1:7> while the chip selection signal CS is enabled. The second semiconductor device 2 may generate the second internal data R2ID from the second pattern data (not shown) to store the second internal data R2ID in the core region 40, during the write copy operation according to a logic level combination of the first to seventh command signals CMD<1:7> while the chip selection signal CS is enabled.

Figure 2:
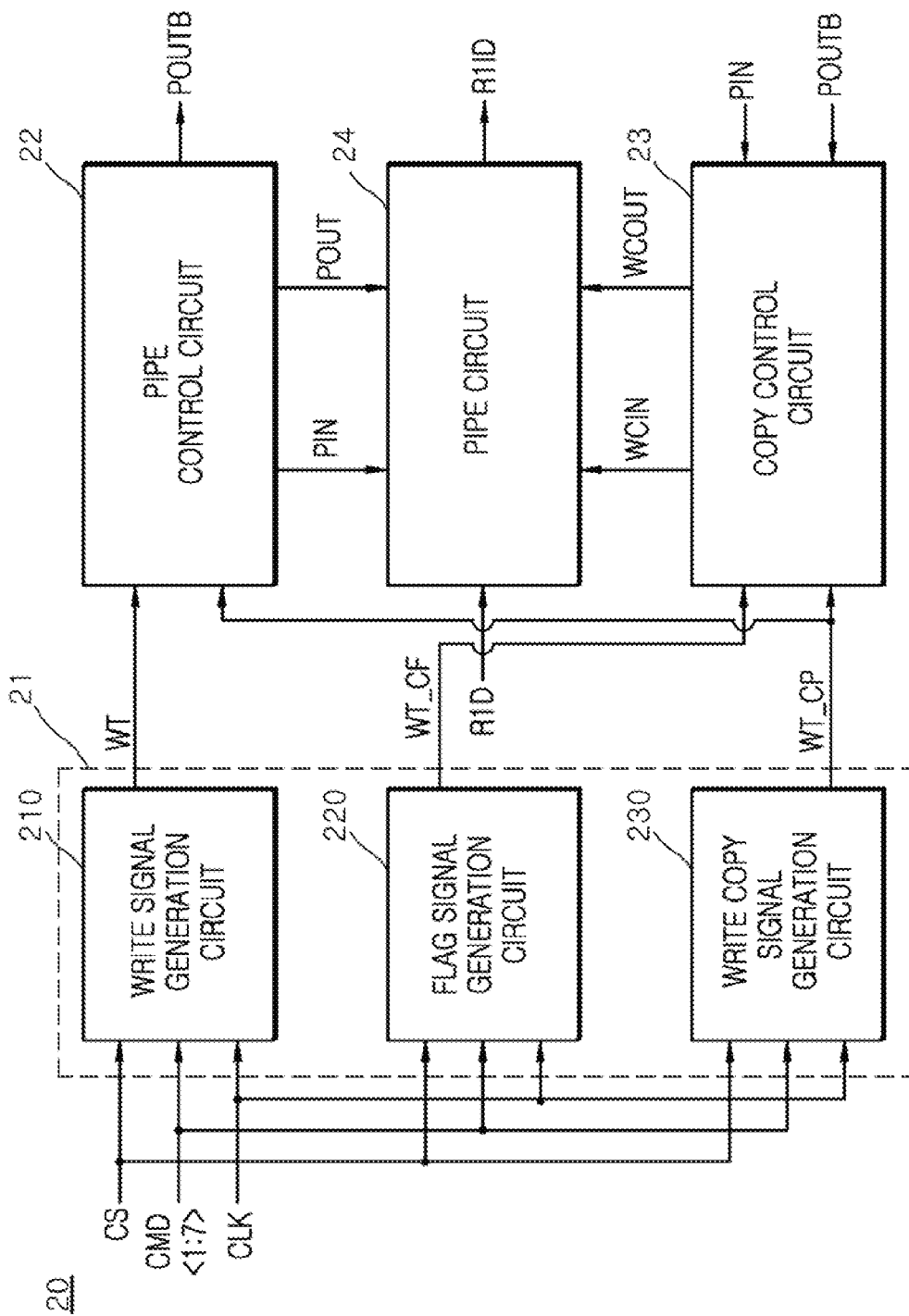
FIG. 2 is a block diagram illustrating a configuration of a first data processing circuit included in the semiconductor system of FIG. 1.

Referring to FIG. 2, the first data processing circuit 20 may include a command decoder 21, a pipe control circuit 22, a copy control circuit 23, and a pipe circuit 24.

The command decoder 21 may include a write signal generation circuit 210, a flag signal generation circuit 220, and a write copy signal generation circuit 230.

The write signal generation circuit 210 may be synchronized with a clock signal CLK to generate a write signal WT which is enabled if the chip selection signal CS is enabled and the first to third command signals CMD<1:3> have a first logic level combination. A logic level combination of the chip selection signal CS and the first to third command signals CMD<1:3> for generating the write signal WT is described more fully below with reference to FIG. 3.

The flag signal generation circuit 220 may be synchronized with the clock signal CLK to generate a flag signal WT_CF, which is enabled if the chip selection signal CS is enabled and the first to seventh command signals CMD<1:7> have a second logic level combination. A logic level combination of the chip selection signal CS and the first to seventh command signals CMD<1:7> for generating the flag signal WT_CF is described more fully below with reference to FIG. 3.

The write copy signal generation circuit 230 may be synchronized with the clock signal CLK to generate a write copy signal WT_CP, which is enabled if the chip selection signal CS is enabled and the first to seventh command signals CMD<1:7> have a third logic level combination. A logic level combination of the chip selection signal CS and the first to seventh command signals CMD<1:7> for generating the write copy signal WT_CP is described more fully below with reference to FIG. 3.

The pipe control circuit 22 may generate an input control signal PIN and an output control signal POUT, which are sequentially enabled if the write signal WT is enabled. The pipe control circuit 22 may delay the write signal WT by a first predetermined period to generate the input control signal PIN which is enabled. The pipe control circuit 22 may delay the write signal WT by a second predetermined period to generate the output control signal POUT which is enabled. The first predetermined period may be set as a period corresponding to a write latency. The write latency may be set as a time period from a point in time when a command for the write operation is inputted to the second semiconductor device 2 until a point in time when data are stored in memory cells of the second semiconductor device 2 in response to the command for the write operation. The second predetermined period may be set to be longer than the first predetermined period. For example, the second predetermined period may be set as a sum of the first predetermined period and an enablement period of the input control signal PIN. The pipe control circuit 22 may generate the output control signal POUT, which is disabled if the write copy signal WT_CP is enabled. The pipe control circuit 22 may invert the output control signal POUT to generate an inverted output control signal POUTB if the write signal WT is enabled.

The copy control circuit 23 may generate a copy input control signal WCIN, which is enabled according to the input control signal PIN if the flag signal WT_CF is enabled. The copy control circuit 23 may generate a copy output control signal WCOUT, which is enabled according to the inverted output control signal POUTB if the write copy signal WT_CP is enabled.

The pipe circuit 24 may latch the first data R1D if the input control signal PIN is inputted thereto and may output the latched signal of the first data R1D as the first internal data R1ID if the output control signal POUT is inputted thereto. The pipe circuit 24 may store the first data R1D as the first pattern data (PD1 of FIG. 9) if the copy input control signal WCIN is inputted thereto and may output the first pattern data (PD1 of FIG. 9) stored therein as the first internal data R1ID if the copy output control signal WCOUT is inputted thereto.

Various logic level combinations of the chip selection signal CS and the first to seventh command signals CMD<1:7> for generating the write signal WT, the flag signal WT_CF, and the write copy signal WT_CP are described with reference to FIG. 3. In FIG. 3, "H" denotes a logic "high" level, and "L" denotes a logic "low" level. In addition, in FIG. 3, "X" means a "DON'T CARE STATE."

The first logic level combination of the chip selection signal CS and the first to seventh command signals CMD<1:7> for generating the write signal WT may be such that the chip selection signal CS has a logic "high" level, the first command signal CMD<1> has a logic "low" level, the second command signal CMD<2> has a logic "high" level, and the third command signal CMD<3> has a logic "high" level, at a rising edge of the clock signal CLK.

The second logic level combination of the chip selection signal CS and the first to seventh command signals CMD<1:7> for generating the flag signal WT_CF may be such that the chip selection signal CS and the first to seventh command signals CMD<1:7> inputted at a rising edge of the clock signal CLK have a logic "high" level, a logic "low" level, a logic "low" level, a logic "high" level, a logic "high" level, a logic "low" level, a logic "low" level, and a logic "low" level, respectively, and the first to seventh command signals CMD<1:7> inputted at a falling edge of the clock signal CLK have a logic "low" level, a logic "low" level, a logic "low" level, a logic "low" level, a logic "high" level, a logic "high" level, and a logic "low" level, respectively. The flag signal WT_CF may be generated in synchronization with a falling edge of the clock signal CLK.

The third logic level combination of the chip selection signal CS and the first to seventh command signals CMD<1:7> for generating the write copy signal WT_CP may be set such that the chip selection signal CS and the first to seventh command signals CMD<1:7> inputted at a rising edge of the clock signal CLK have a logic "high" level, a logic "low" level, a logic "low" level, a logic "high" level, a logic "high" level, a logic "low" level, a logic "low" level and a logic "low" level, respectively, and the first to seventh command signals CMD<1:7> inputted at a falling edge of the clock signal CLK have a logic "low" level, a logic "low" level, a logic "low" level, a logic "low" level, a logic "high" level, a logic "high" level, and a logic "high" level, respectively.

The write copy signal WT_CP may be generated in synchronization with a falling edge of the clock signal CLK. The write copy signal WT_CP may be generated in synchronization with a falling edge of the clock signal CLK.

Figure 4:
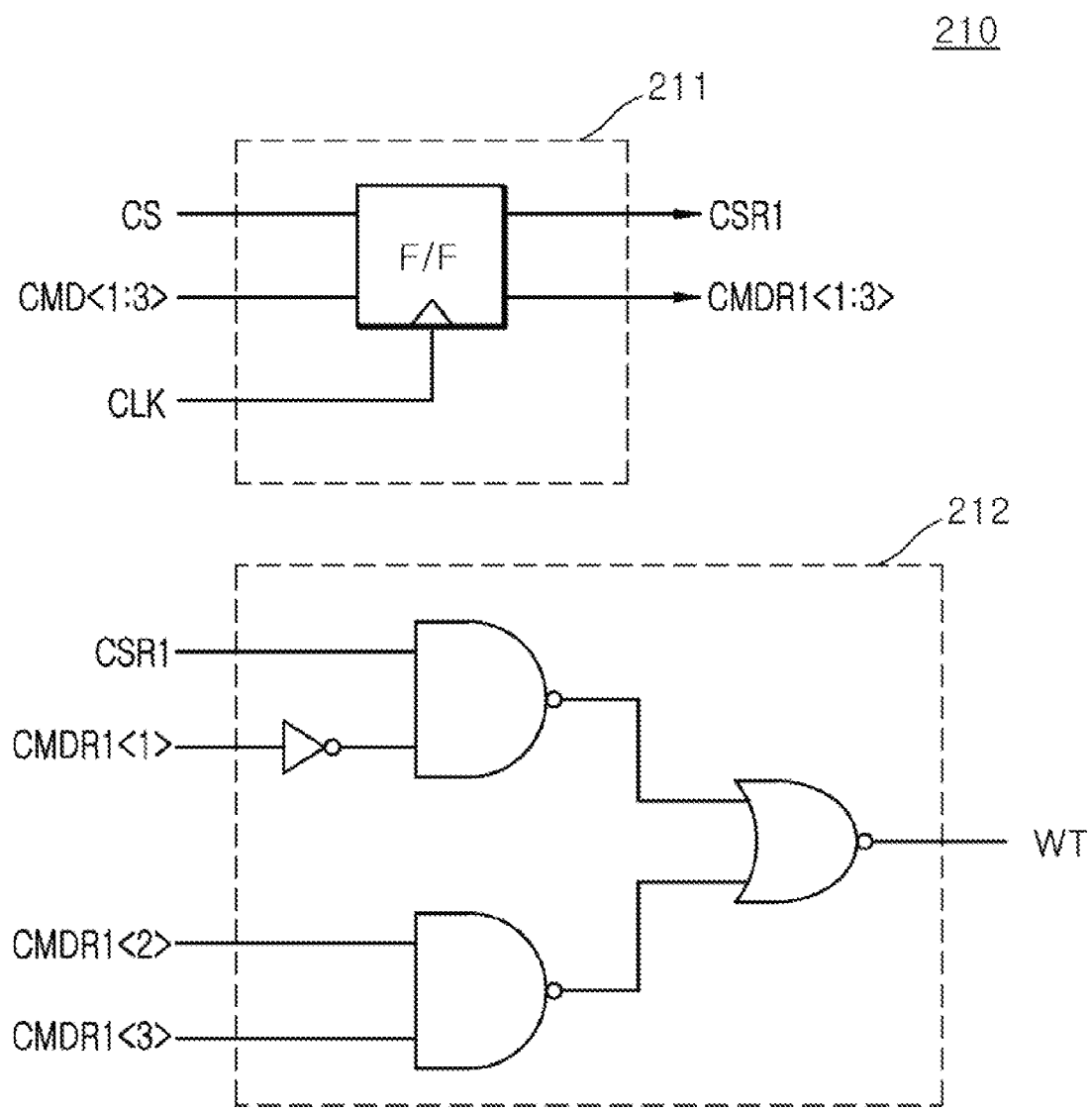
FIG. 4 is a circuit diagram illustrating a configuration of a write signal generation circuit included in the first data processing circuit of FIG. 2.

Referring to FIG. 4, the write signal generation circuit 210 may include a first synchronization circuit 211 and a first logic circuit 212.

The first synchronization circuit 211 may latch the chip selection signal CS in synchronization with a rising edge of the clock signal CLK to generate a first rising chip selection signal CSR1. The first synchronization circuit 211 may latch the first to third command signals CMD<1:3> in synchronization with a rising edge of the clock signal CLK to generate first to third high-order rising command signals CMDR1<1:3>.

The first logic circuit 212 may generate the write signal WT which is enabled to have a logic "high" level if the chip selection signal CS is enabled to have a logic "high" level and the first to third high-order rising command signals CMDR1<1:3> have the first logic level combination, as described with reference to FIG. 3.

Figure 5:
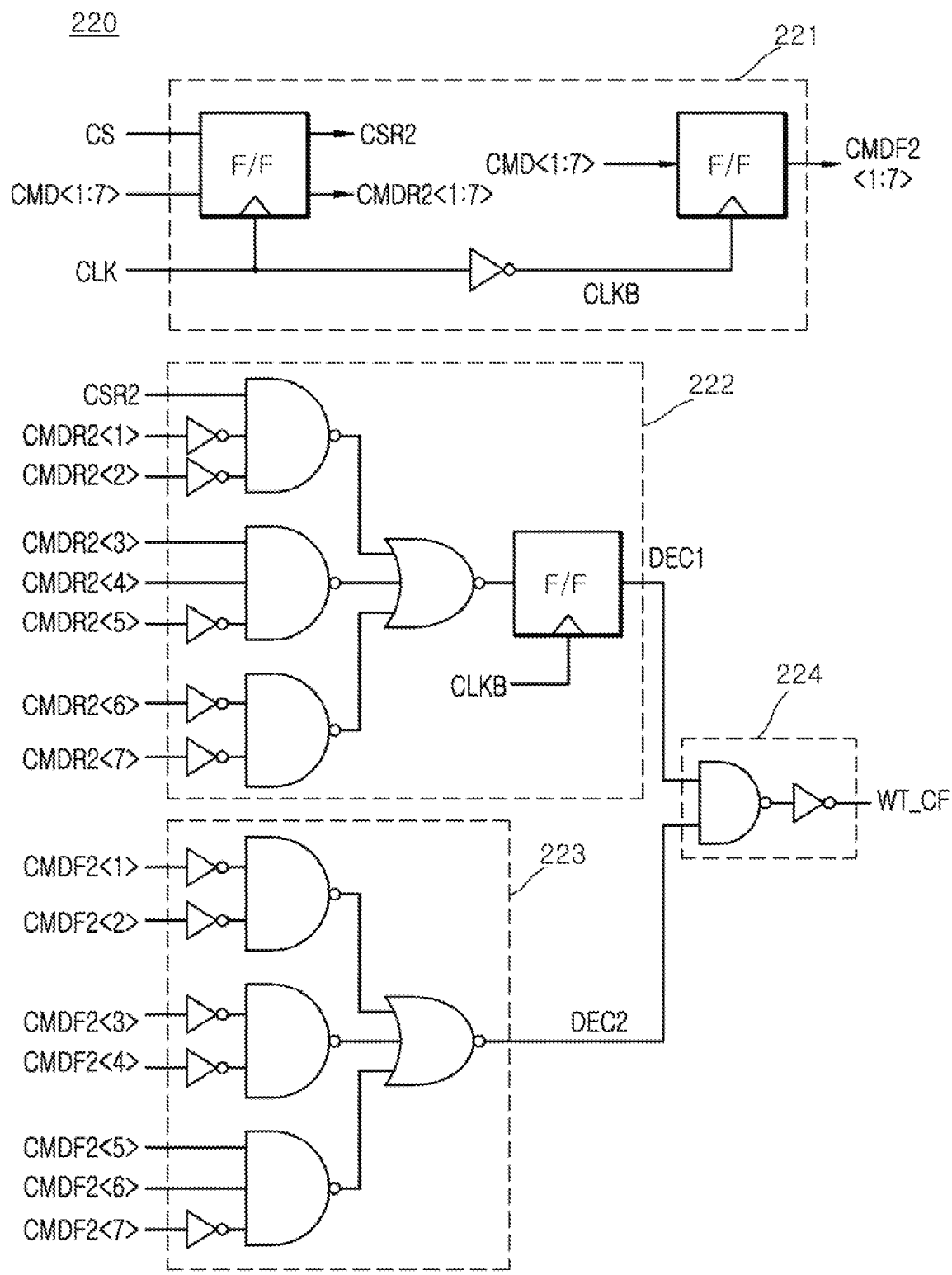
FIG. 5 is a circuit diagram illustrating a configuration of a flag signal generation circuit included in the first data processing circuit of FIG. 2.

Referring to FIG. 5, the flag signal generation circuit 220 may include a second synchronization circuit 221, a first decoded signal generation circuit 222, a second decoded signal generation circuit 223, and a second logic circuit 224.

The second synchronization circuit 221 may latch the chip selection signal CS in synchronization with a rising edge of the clock signal CLK to generate a second rising chip selection signal CSR2. The second synchronization circuit 221 may latch the first to seventh command signals CMD<1:7> in synchronization with a rising edge of the clock signal CLK to generate first to seventh mid-order rising command signals CMDR2<1:7>. The second synchronization circuit 221 may latch the first to seventh command signals CMD<1:7> in synchronization with an inverted clock signal CLKB having an inverted level of the clock signal CLK to generate first to seventh mid-order falling command signals CMDF2<1:7>.

The first decoded signal generation circuit 222 may decode the second rising chip selection signal CSR2 and the first to seventh mid-order rising command signals CMDR2<1:7> in synchronization with the inverted clock signal CLKB to generate a first decoded signal DEC1. The first decoded signal generation circuit 222 may generate the first decoded signal DEC1, which is enabled to have a logic "high" level if the chip selection signal CS and the first to seventh command signals CMD<1:7> inputted at a rising edge of the clock signal CLK have the second logic level combination, as described with reference to FIG. 3.

The second decoded signal generation circuit 223 may decode the first to seventh mid-order falling command signals CMDF2<1:7> to generate a second decoded signal DEC2. The second decoded signal generation circuit 223 may generate the second decoded signal DEC2 which is enabled to have a logic "high" level if the first to seventh command signals CMD<1:7> inputted at a falling edge of the clock signal CLK have the second logic level combination, as described with reference to FIG. 3.

The second logic circuit 224 may generate the flag signal WT_CF, which is enabled to have a logic "high" level if the first and second decoded signals DEC1 and DEC2 are enabled to have a logic "high" level.

Figure 6:
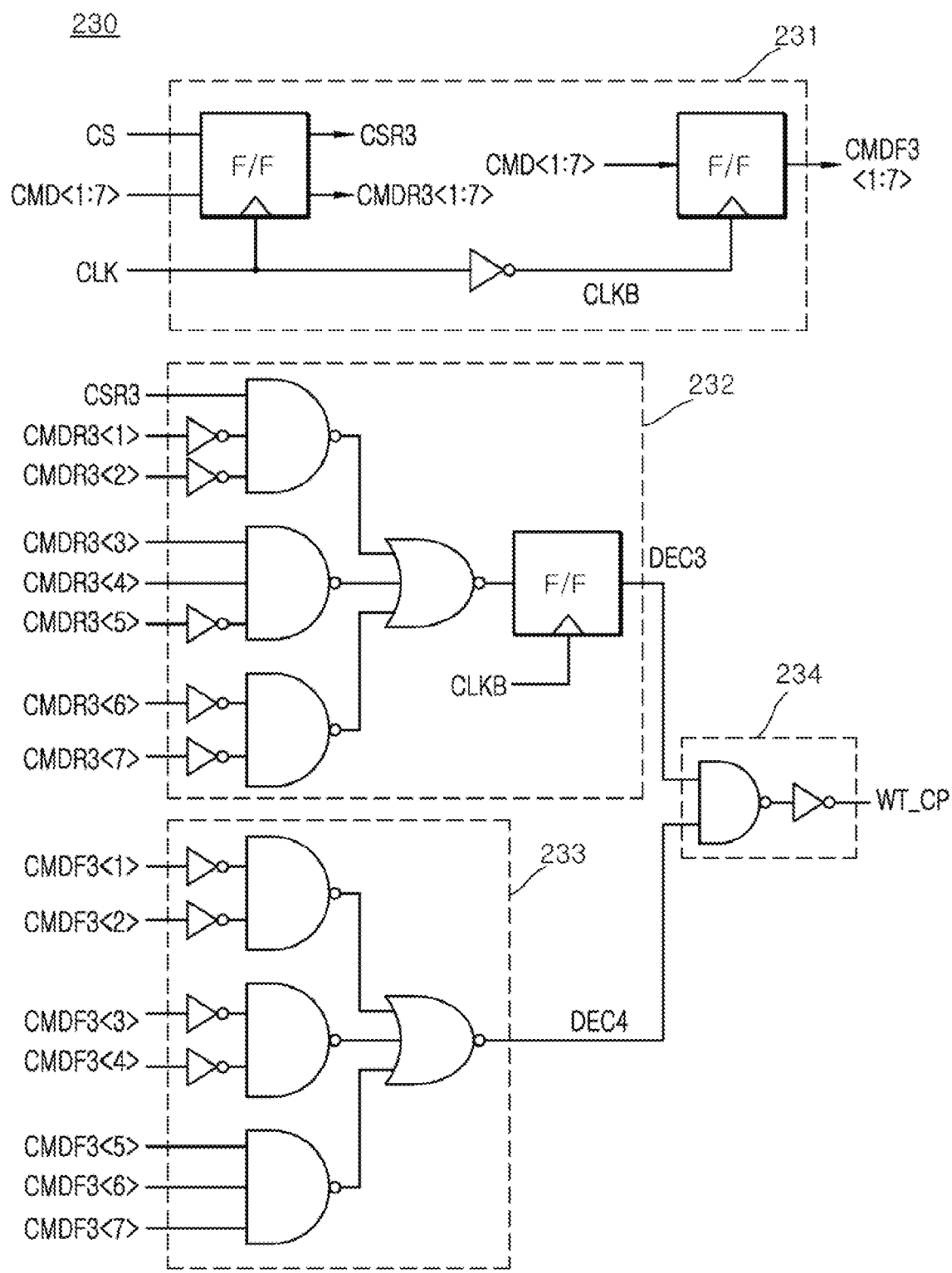
FIG. 6 is a circuit diagram illustrating a configuration of a write copy signal generation circuit included in the first data processing circuit of FIG. 2.

Referring to FIG. 6, the write copy signal generation circuit 230 may include a third synchronization circuit 231, a third decoded signal generation circuit 232, a fourth decoded signal generation circuit 233, and a third logic circuit 234.

The third synchronization circuit 231 may latch the chip selection signal CS in synchronization with a rising edge of the clock signal CLK to generate a third rising chip selection signal CSR3. The third synchronization circuit 231 may latch the first to seventh command signals CMD<1:7> in synchronization with a rising edge of the clock signal CLK to generate first to seventh low-order rising command signals CMDR3<1:7>. The third synchronization circuit 231 may latch the first to seventh command signals CMD<1:7> in synchronization with the inverted clock signal CLKB to generate first to seventh low-order falling command signals CMDF3<1:7>.

The third decoded signal generation circuit 232 may decode the third rising chip selection signal CSR3 and the first to seventh low-order rising command signals CMDR3<1:7> in synchronization with the inverted clock signal CLKB to generate a third decoded signal DEC3. The third decoded signal generation circuit 232 may generate the third decoded signal DEC3 which is enabled to have a logic "high" level if the chip selection signal CS and the first to seventh command signals CMD<1:7> inputted at a rising edge of the clock signal CLK have the third logic level combination, as described with reference to FIG. 3.

The fourth decoded signal generation circuit 233 may decode the first to seventh low-order falling command signals CMDF3<1:7> to generate a fourth decoded signal DEC4. The fourth decoded signal generation circuit 233 may generate the fourth decoded signal DEC4, which is enabled to have a logic "high" level if the first to seventh command signals CMD<1:7> inputted at a falling edge of the clock signal CLK have the third logic level combination, as described with reference to FIG. 3.

The third logic circuit 234 may generate the write copy signal WT_CP, which is enabled to have a logic "high" level if the third and fourth decoded signals DEC3 and DEC4 are enabled to have a logic "high" level.

Figure 7:
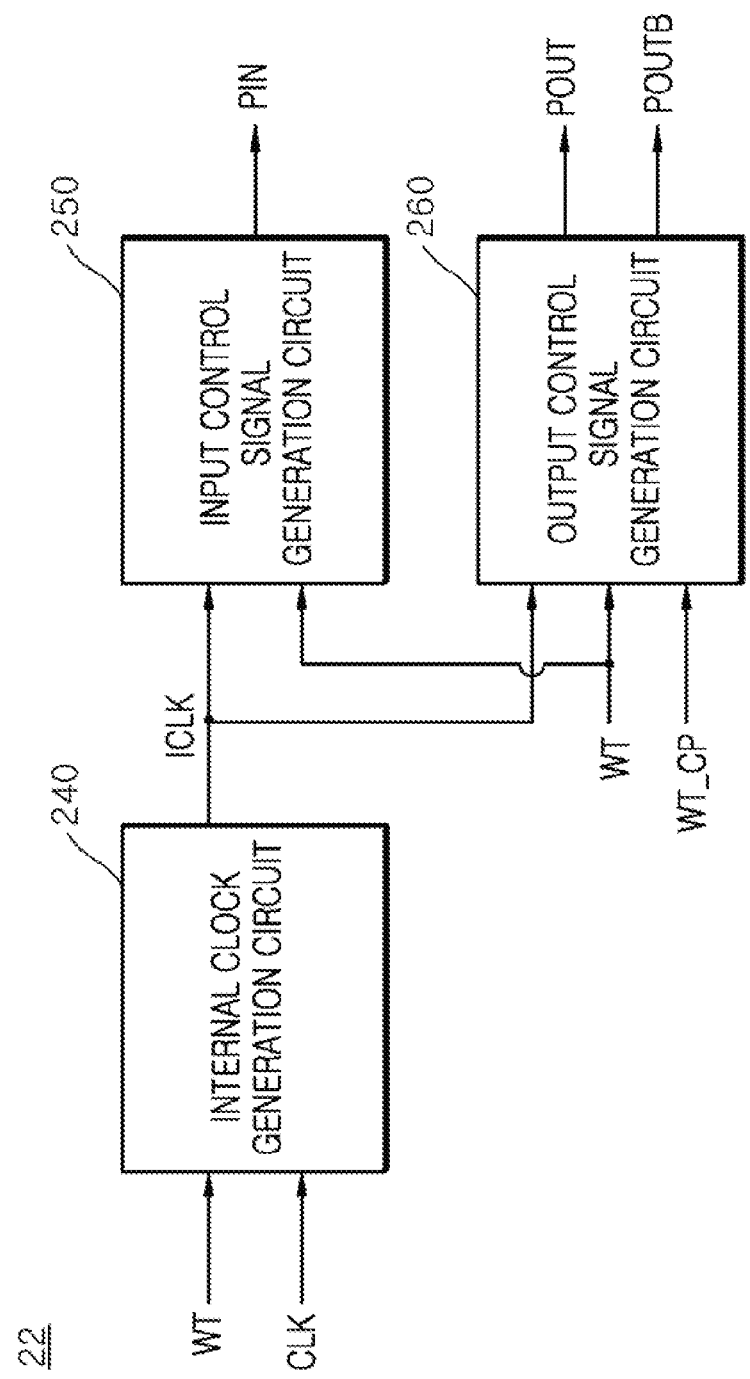
FIG. 7 is a block diagram illustrating a configuration of a pipe control circuit included in the first data processing circuit of FIG. 2.

Referring to FIG. 7, the pipe control circuit 22 may include an internal clock generation circuit 240, an input control signal generation circuit 250, and an output control signal generation circuit 260.

The internal clock generation circuit 240 may generate an internal clock signal ICLK that is toggled in synchronization with the clock signal CLK if the write signal WT is inputted to the internal clock generation circuit 240.

The input control signal generation circuit 250 may delay the write signal WT by the first predetermined period in synchronization with the internal clock signal ICLK to generate the input control signal PIN. The input control signal generation circuit 250 may delay the write signal WT by the write latency in synchronization with the internal clock signal ICLK to generate the input control signal PIN.

The output control signal generation circuit 260 may delay the write signal WT by the second predetermined period in synchronization with the internal clock signal ICLK to generate the output control signal POUT. The output control signal generation circuit 260 may delay the write signal WT by a sum of the write latency and an enablement period of the input control signal PIN in synchronization with the internal clock signal ICLK to generate the output control signal POUT. The output control signal generation circuit 260 may generate the output control signal POUT which is disabled if the write copy signal WT_CP is enabled. The output control signal generation circuit 260 may invert the output control signal POUT to generate the inverted output control signal POUTB.

Figure 8:
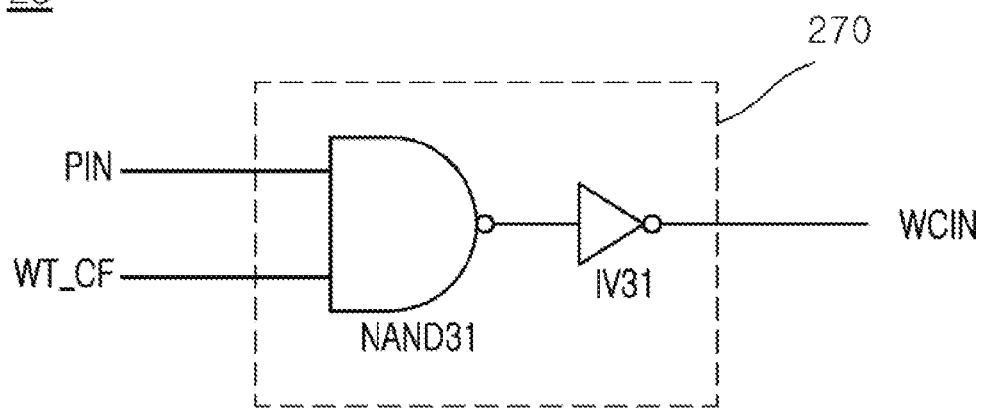
FIG. 8 is a circuit diagram illustrating a configuration of a copy control circuit included in the first data processing circuit of FIG. 2.
Figure 8:
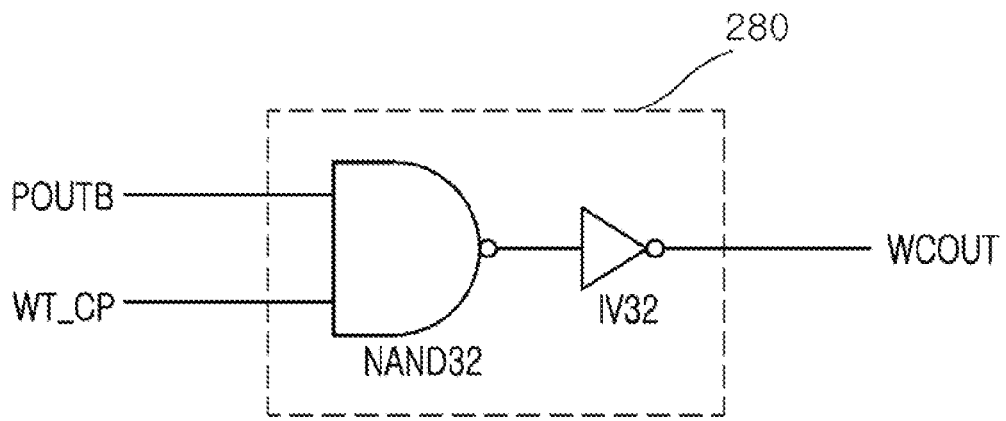

Referring to FIG. 8, the copy control circuit 23 may include a copy input control signal generation circuit 270 and a copy output control signal generation circuit 280.

The copy input control signal generation circuit 270 may include a NAND gate NAND31 and an inverter IV31. The copy input control signal generation circuit 270 may generate the copy input control signal WCIN, which is enabled according to the input control signal PIN if the flag signal WT_CF is enabled. The copy input control signal generation circuit 270 may generate the copy input control signal WCIN, which is enabled to have a logic "high" level if the input control signal PIN has a logic "high" level while the flag signal WT_CF is enabled to have a logic "high" level.

The copy output control signal generation circuit 280 may include a NAND gate NAND32 and an inverter IV32. The copy output control signal generation circuit 280 may generate the copy output control signal WCOUT, which is enabled according to the inverted output control signal POUTB if the write copy signal WT_CP is enabled. The copy output control signal generation circuit 280 may generate the copy output control signal WCOUT, which is enabled to have a logic "high" level if the inverted output control signal POUTB has a logic "high" level while the write copy signal WT_CP is enabled to have a logic "high" level.

Figure 9:
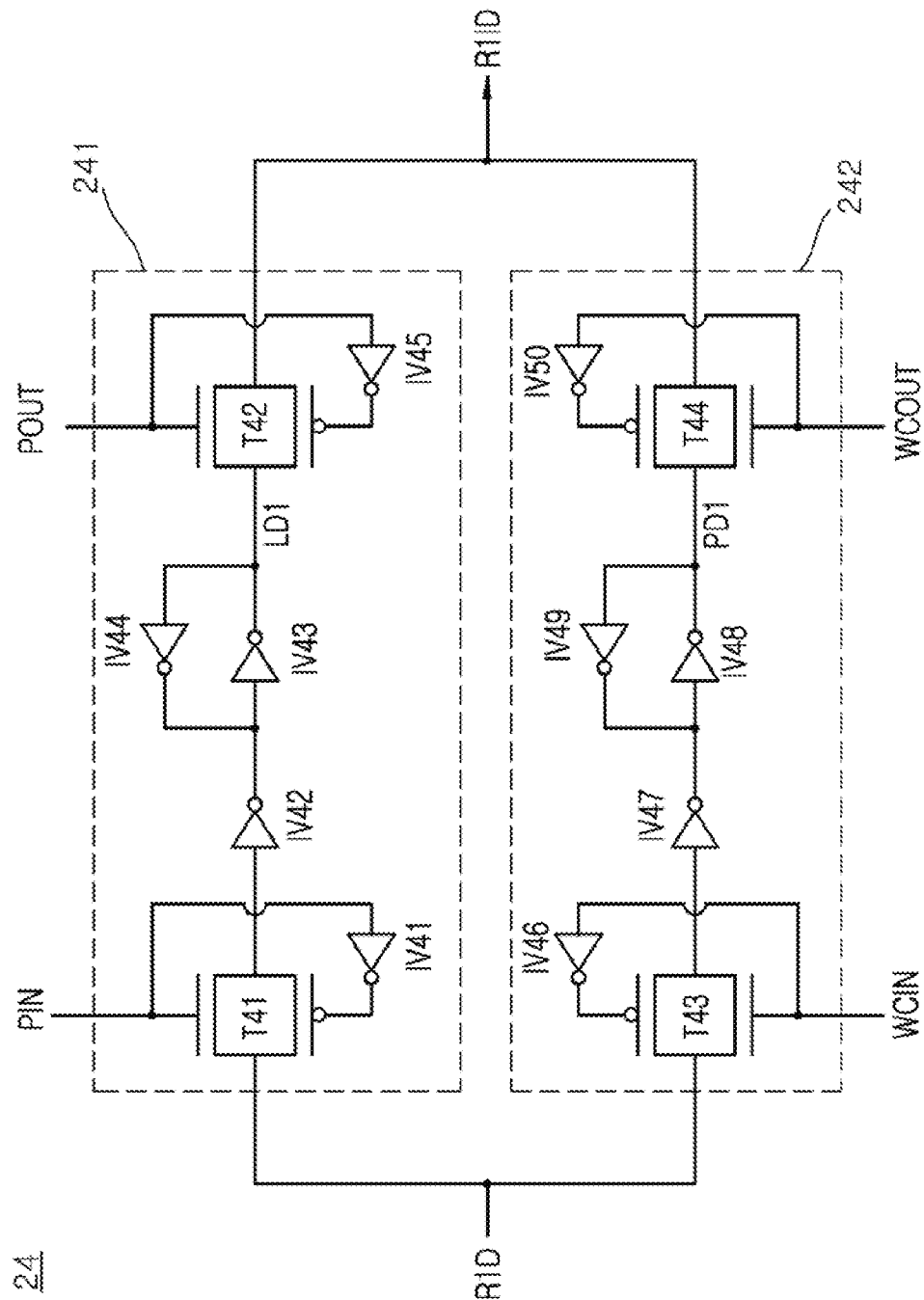
FIG. 9 is a circuit diagram illustrating a configuration of a pipe circuit included in the first data processing circuit of FIG. 2.

Referring to FIG. 9, the pipe circuit 24 may include a first latch circuit 241 and a second latch circuit 242.

The first latch circuit 241 may include transfer gates T41 and T42 and inverters IV41, IV42, IV43, IV44, and IV45. The first latch circuit 241 may latch the first data R1D to generate first latched data LD1 if the input control signal PIN has a logic "high" level. The first latch circuit 241 may output the first latched data LD1 as the first internal data R1ID if the output control signal POUT has a logic "high" level.

The second latch circuit 242 may include transfer gates T43 and T44 and inverters IV46, IV47, IV48, IV49, and IV50. The second latch circuit 242 may latch the first data R1D to generate the first pattern data PD1 if the copy input control signal WCIN has a logic "high" level. The second latch circuit 242 may output the first pattern data PD1 as the first internal data R1ID if the copy output control signal WCOUT has a logic "high" level.

The second data processing circuit 30 illustrated in FIG. 1 may receive the second data R2D to generate the second internal data R2ID and may be realized using the same circuit as the first data processing circuit 20 to perform the same operation as the first data processing circuit 20. Thus, a detailed description of the second data processing circuit 30 is omitted here.

Figure 10:
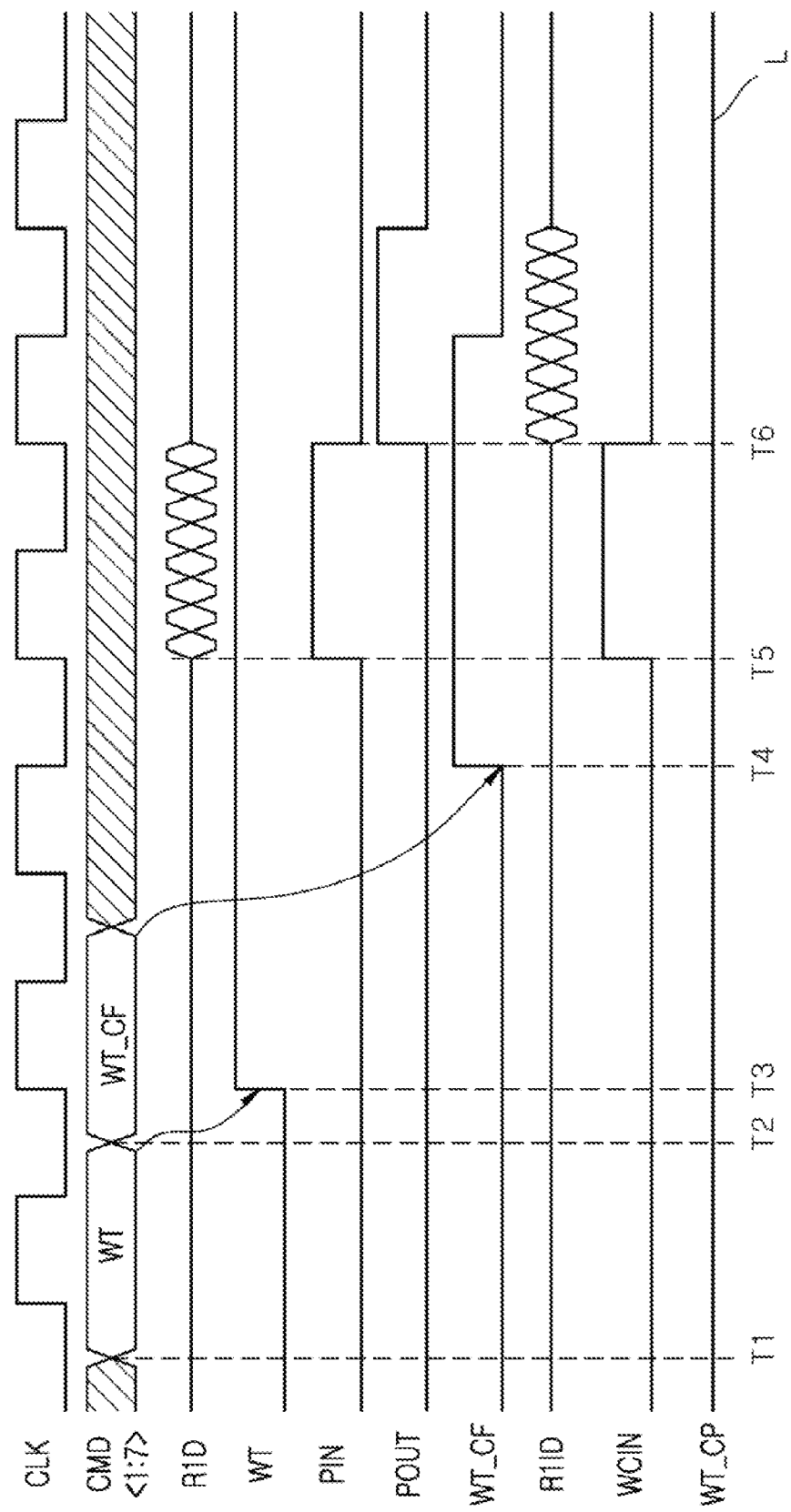
FIGS. 10 and 11 are timing diagrams illustrating operations of a semiconductor system according to an embodiment of the present disclosure.
Figure 11:
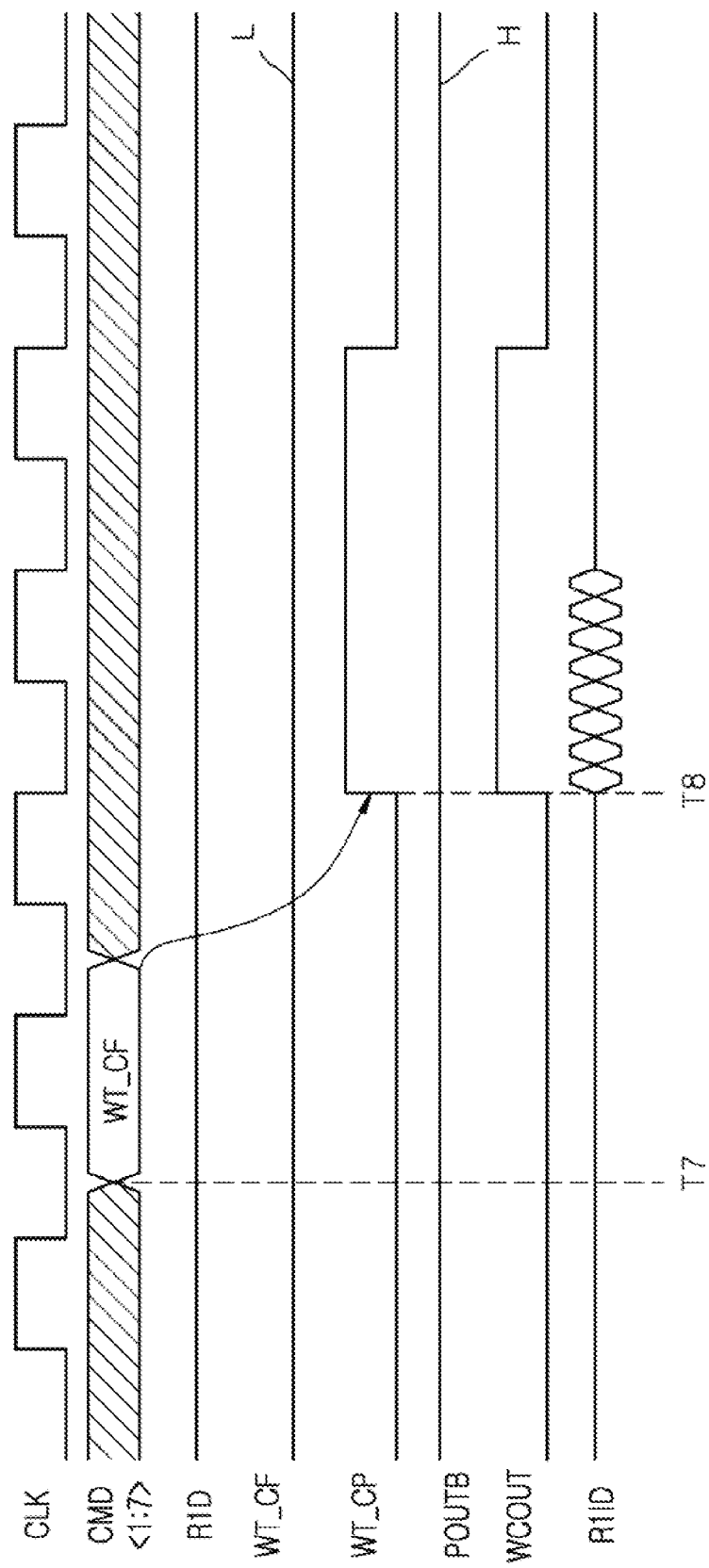

The write operation and the write copy operation of a semiconductor system having the above-described configuration is described with reference to FIGS. 10 and 11 in conjunction with an example for which the write operation and the write copy operation are successively performed with the first data processing circuit 20. In FIGS. 10 and 11, "L" indicates a logic "low" level and "H" indicates a logic "high" level.

First, the write operation is described with reference to FIG. 10.

At a time "T1," the first semiconductor device 1 may output the chip selection signal CS, the first to third command signals CMD<1:3>, and the first and second address signals ADD<1:2> to the second semiconductor device 2. In this case, the first to third command signals CMD<1:3> may have the first logic level combination for performing the write operation.

At a time "T2," the first semiconductor device 1 may output the chip selection signal CS and the first to seventh command signals CMD<1:7> to the second semiconductor device 2. In this case, the first to seventh command signals CMD<1:7> may have the second logic level combination.

At a time "T3," the write signal generation circuit 210 may generate the write signal WT, which is enabled to have a logic "high" level if the chip selection signal CS is enabled because the first to third command signals CMD<1:3> inputted at the time "T1" have the first logic level combination.

At a time "T4", the flag signal generation circuit 220 may be synchronized with the clock signal CLK to generate the flag signal WT_CF, which is enabled to have a logic "high" level if the chip selection signal CS is enabled because the first to seventh command signals CMD<1:7> inputted at the time "T2" have the second logic level combination.

The write copy signal generation circuit 230 may be synchronized with the clock signal CLK to generate the write copy signal WT_CP, which is disabled to have a logic "low" level if the chip selection signal CS is enabled because the first to seventh command signals CMD<1:7> inputted at the time "T2" have the second logic level combination.

At a time "T5," the first semiconductor device 1 may output the first data R1D to the second semiconductor device 2.

The pipe control circuit 22 may delay the write signal WT generated at the time "T3" by the write latency corresponding to the first predetermined period to generate the input control signal PIN, which is enabled to have a logic "high" level.

The copy control circuit 23 may generate the copy input control signal WCIN, which is enabled to have a logic "high" level according to the flag signal WT_CF having a logic "high" level and the input control signal PIN having a logic "high" level.

The pipe circuit 24 may latch the first data R1D because the input control signal PIN having a logic "high" level is inputted to the pipe circuit 24. The pipe circuit 24 may store the first data R1D as the first pattern data PD1 because the copy input control signal WCIN having a logic "high" level is inputted to the pipe circuit 24.

At a time "T6," the pipe control circuit 22 may delay the write signal WT generated at the time "T3" by a sum of the write latency (i.e., the second predetermined period) and an enablement period of the input control signal PIN to generate the output control signal POUT, which is enabled to have a logic "high" level.

The pipe circuit 24 may output the first data R1D latched at the time "T5" as the first internal data R1ID because the output control signal POUT having a logic "high" level is inputted to the pipe circuit 24.

The core region 40 may store the first internal data R1ID in the first bank group BG1, the second bank group BG2, the third bank group BG3, or the fourth bank group BG4, which is selected according to the first and second address signals ADD<1:2> that are inputted at the time "T1."

Next, the write copy operation is described with reference to FIG. 11.

At a time "T7," the first semiconductor device 1 may output the chip selection signal CS, the first to seventh command signals CMD<1:7>, and the first and second address signals ADD<1:2> to the second semiconductor device 2. In this case, the first to seventh command signals CMD<1:7> may have the third logic level combination for performing the write copy operation.

At a time "T8," the flag signal generation circuit 220 may be synchronized with the clock signal CLK to generate the flag signal WT_CF, which is disabled to have a logic "low" level if the chip selection signal CS is enabled because the first to seventh command signals CMD<1:7> inputted at the time "T7" have the third logic level combination.

The write copy signal generation circuit 230 may be synchronized with the clock signal CLK to generate the write copy signal WT_CP, which is enabled to have a logic "high" level if the chip selection signal CS is enabled because the first to seventh command signals CMD<1:7> inputted at the time "T7" have the third logic level combination.

The copy control circuit 23 may generate the copy output control signal WCOUT, which is enabled to have a logic "high" level according to the inverted output control signal POUTB having a logic "high" level and the write copy signal WT_CP having a logic "high" level.

The pipe circuit 24 may output the first pattern data PD1 stored in the pipe circuit 24 at the time "T5" as the first internal data R1ID because the copy output control signal WCOUT having a logic "high" level is inputted to the pipe circuit 24.

The core region 40 may store the first internal data R1ID in the first bank group BG1, the second bank group BG2, the third bank group BG3, or the fourth bank group BG4, which is selected according to the first and second address signals ADD<1:2> that are inputted at the time "T7."

As described above, a semiconductor system according to an embodiment may store data to be stored in a core region in a pipe circuit as pattern data during a write operation and may store the pattern data stored in the pipe circuit in the core region during a write copy operation. Thus, because a signal for receiving and strobing external data is not required during the write copy operation, it may be possible to reduce power consumption of the semiconductor system. In addition, because the semiconductor system stores the data to be stored in the core region in the pipe circuit as the pattern data during the write operation and stores the pattern data stored in the pipe circuit in the core region during the write copy operation, it may be possible to store the pattern data having various patterns in the core region without receiving data.

Figure 12:
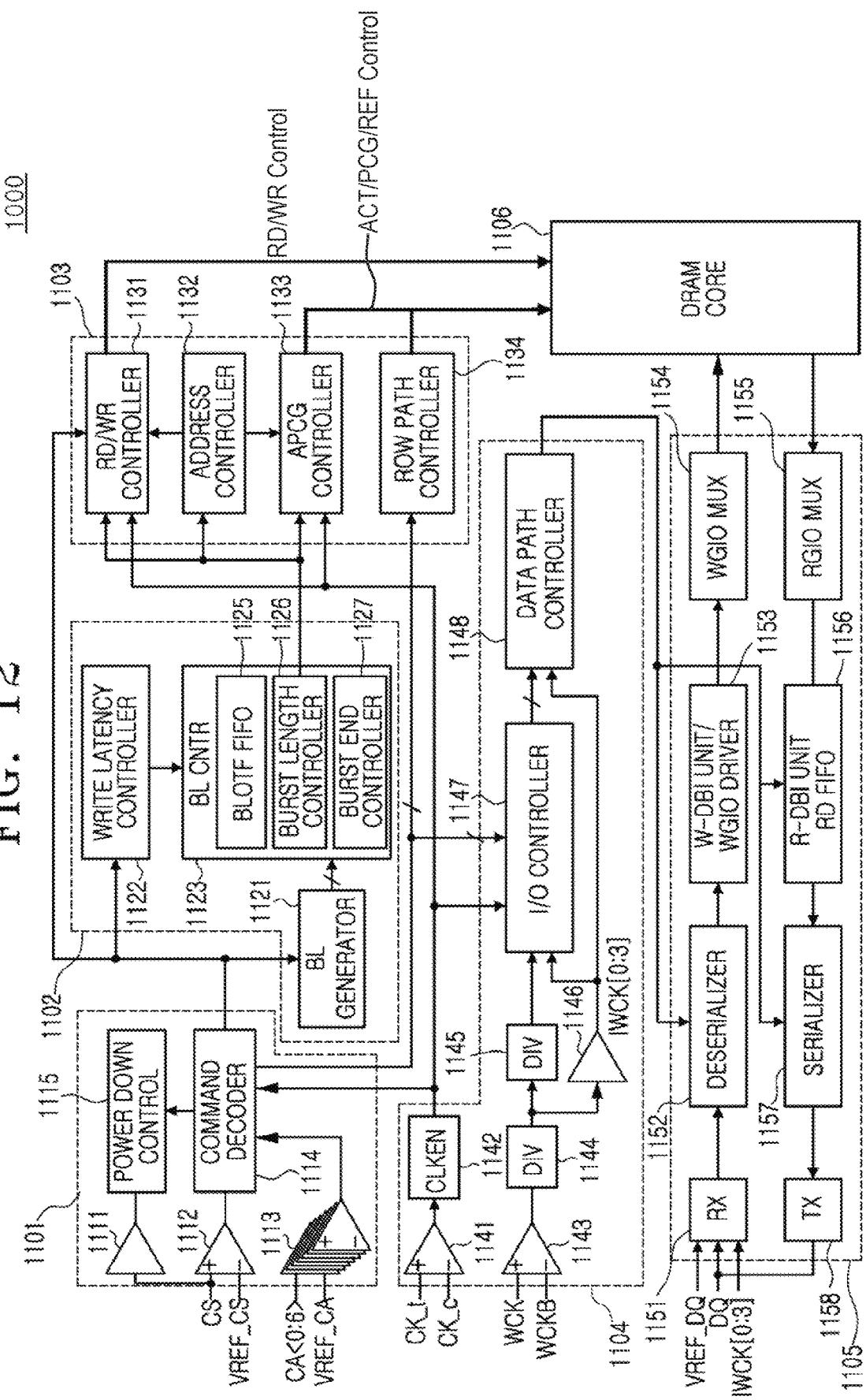
FIG. 12 is a block diagram illustrating a configuration of a semiconductor device, according to another embodiment of the present disclosure.

Referring to FIG. 12, a semiconductor device 1000, according to another embodiment, may include a command control circuit 1101, a latency/burst control circuit 1102, an operation control circuit 1103, an input/output (I/O) control circuit 1104, a data I/O circuit 1105, and a DRAM core 1106.

The command control circuit 1101 may include an input drive circuit 1111, a chip selection signal buffer 1112, a command/address buffer 1113, a command decoder 1114, and a power-down control circuit 1115. The input drive circuit 1111 may receive and drive a chip selection signal CS to transmit the chip selection signal CS to the power-down control circuit 1115. The chip selection signal buffer 1112 may buffer the chip selection signal CS based on a chip selection reference voltage VREF_CS. The command/address buffer 1113 may buffer a command/address signal CA<0:6> based on a command/address reference voltage VREF_CA. The command decoder 1114 may decode the command/address signal CA<0:6> buffered by the command/address buffer 1113 based on the chip selection signal CS buffered by the chip selection signal buffer 1112 to generate various commands for the operation of the semiconductor device 1000. The power-down control circuit 1115 may control a power-down mode based on the chip selection signal CS driven by the input drive circuit 1111 and a command generated by the command decoder 1114.

The latency/burst control circuit 1102 may include a burst length information generator 1121, a write latency controller 1122, and a burst length control circuit 1123. The burst length information generator 1121 may generate information necessary for control of a burst length operation based on a command generated by the command decoder 1114. The write latency controller 1122 may perform a control operation according to a write latency based on a command generated by the command decoder 1114. The burst length control circuit 1123 may include an information storage circuit 1125 storing information outputted from the burst length information generator 1121. The burst length control circuit 1123 may include a burst length controller 1126 for controlling the burst length operation based on a command generated by the command decoder 1114, a signal outputted from the write latency controller 1122, and information outputted from the burst length information generator 1121. The burst length control circuit 1123 may include a burst end controller 1127 for controlling a burst end operation based on a command generated by the command decoder 1114, a signal outputted from the write latency controller 1122, and information outputted from the burst length information generator 1121.

The operation control circuit 1103 may include a read/write controller 1131, an address controller 1132, an auto-pre-charge controller 1133, and a row path controller 1134 to generate a read/write control signal RD/WR_Control for controlling a read operation and a write operation as well as a row path control signal ACT/PCG/REF_Control for controlling an active operation, a pre-charge operation, and a refresh operation. The read/write controller 1131 may control the read operation and the write operation based on a signal outputted from the latency/burst control circuit 1102 and a signal outputted from the address controller 1132 if clock signals CK_t and CK_c are activated. The address controller 1132 may control generation of an address based on a signal outputted from the latency/burst control circuit 1102. The auto-pre-charge controller 1133 may control an auto-pre-charge operation based on a signal outputted from the latency/burst control circuit 1102 if the clock signals CK_t and CK_c are activated. The row path controller 1134 may control a row path based on a command generated by the command decoder 1114.

The I/O control circuit 1104 may include a first clock buffer 1141, a clock enablement signal generator 1142, a second clock buffer 1143, a first divider 1144, a second divider 1145, an internal clock driver 1146, an I/O controller 1147, and a data path controller 1148. The first clock buffer 1141 may receive and buffer the clock signals CK_t and CK_c. The clock enablement signal generator 1142 may generate a clock enablement signal after the clock signals CK_t and CK_c buffered by the first clock buffer 241 are activated. The second clock buffer 1143 may receive and buffer data clock signals WCK and WCKB for input and output of the data. The first divider 1144 may divide the data clock signals WCK and WCKB buffered by the second clock buffer 1143. The second divider 1145 may receive and divide an output signal of the first divider 1144. The internal clock driver 1146 may receive and divide an output signal of the first divider 1144 to generate an internal data clock signal IWCK[0:3]. The I/O controller 1147 may receive a signal divided by the second divider 1145 and the internal data clock signal IWCK[0:3] generated by the internal clock driver 1146 to control the input and output of the data. The data path controller 1148 may control a data path used in the input and output of the data based on a signal outputted from the I/O controller 1147 and the internal data clock signal IWCK[0:3] generated by the internal clock driver 1146.

The data I/O circuit 1105 may include a receiver 1151, a deserializer 1152, a write driver 1153, a write multiplexer 1154, a read multiplexer 1155, a read driver 1156, a serializer 1157, and a transmitter 1158. The receiver 1151 may be synchronized with the internal data clock signal IWCK[0:3] to receive transmission data DQ based on a data reference voltage VREF_DQ. The deserializer 1152 may convert the transmission data DQ inputted in series through the receiver 1151 into parallel data. The write driver 1153 may drive the parallel data to transmit the driven parallel data to the write multiplexer 1154. The write multiplexer 1154 may transmit the data driven by the write driver 1153 to the DRAM core 1106 using a multiplexing technique with an I/O line. The read multiplexer 1155 may output the data outputted from the DRAM core 1106 through the I/O line to the read driver 1156 using a multiplexing technique during the read operation. The read driver 1156 may drive the data outputted from the DRAM core 1106 through the read multiplexer 1155 to output the driven data to the serializer 1157. The serializer 1157 may convert the data outputted from the read driver 1156 into serial data. The transmitter 1158 may output the serial data converted by the serializer 1157 as the transmission data DQ.

A circuit including the command control circuit 1101, the latency/burst control circuit 1102, the operation control circuit 1103, the input/output (I/O) control circuit 1104, and the data I/O circuit 1105 may have substantially the same function as the first and second data processing circuits 20 and 30 included in the second semiconductor device 2 described with reference to FIGS. 1 to 11 except I/O signals thereof. Thus, the circuit including the command control circuit 1101, the latency/burst control circuit 1102, the operation control circuit 1103, the input/output (I/O) control circuit 1104, and the data I/O circuit 1105 may be realized using the first and second data processing circuits 20 and 30. For example, the circuit including the command control circuit 1101, the latency/burst control circuit 1102, the operation control circuit 1103, the input/output (I/O) control circuit 1104, and the data I/O circuit 1105 may be replaced with the first and second data processing circuits 20 and 30 to control an operation for storing data to be stored in the DRAM core 1106 in the pipe circuit 24 as pattern data during the write operation and for storing the pattern data stored in the pipe circuit 24 in the DRAM core 1106 during the write copy operation.

The DRAM core 1106 may perform the read operation or the write operation for outputting or receiving the data through the data I/O circuit 1105 based on the read/write control signal RD/WR_Control. The DRAM core 1106 may perform the active operation, the pre-charge operation, or the refresh operation based on the row path control signal ACT/PCG/REF_Control. The DRAM core 1106 may have substantially the same function as the core region 40 included in the second semiconductor device 2 illustrated in FIG. 1 except I/O signals thereof. Thus, the DRAM core 1106 may store the pattern data stored in the pipe circuit 24 during the write copy operation.

What is claimed is:

1. A semiconductor system comprising:
 a first semiconductor device configured to output a chip selection signal, a command signal, and data; and
 a second semiconductor device comprising:
   a first latch circuit configured to:
     receive, when the chip selection signal is enabled and a write operation is performed according to a first logic level combination of the command signal, the data;
     latch, when the write operation is performed, the data as latched data; and
     output, when the write operation is performed, the latched data as internal data to be stored by the second semiconductor device; and
   a second latch circuit configured to:
     receive, when the write operation is performed, the data;
     latch, when the write operation is performed, the data as pattern data; and
     output, when the chip selection signal is enabled and a write copy operation is performed according to a second logic level combination of the command signal, the pattern data as the internal data to be stored by the second semiconductor device without the second semiconductor device receiving the data, wherein the write copy operation is performed after the write operation is performed.

2. The semiconductor system of claim 1,
 wherein the chip selection signal is inputted to the second semiconductor device through a first pad;
 wherein the command signal is inputted to the second semiconductor device through a second pad; and
 wherein the data is inputted to the second semiconductor device through a third pad.

3. The semiconductor system of claim 1, wherein the second semiconductor device comprises:
 a pipe circuit, wherein the data is stored in the pipe circuit as the pattern data during the write operation; and
 a core region, wherein the internal data generated from the pattern data stored in the pipe circuit is stored in the core region during the write copy operation.

4. The semiconductor system of claim 1, wherein the second semiconductor device comprises:
 a data processing circuit configured to generate the internal data from the data, to generate the pattern data from the data, to store the pattern data, and to generate the internal data from the pattern data according to a logic level combination of the command signal when the chip selection signal is enabled; and
 a core region comprising a plurality of bank groups, wherein the internal data is stored in one of the bank groups, which is selected according to an address signal.

5. The semiconductor system of claim 4, wherein the data processing circuit comprises:
 a command decoder configured to decode the command signal to generate a write signal, to decode the command signal to generate a flag signal, and to decode the command signal to generate a write copy signal, when the chip selection signal is enabled; and
 a pipe control circuit configured to generate an input control signal and an output control signal, which are sequentially enabled when the write signal is enabled, wherein the output control signal is disabled when the write copy signal is enabled;
 a copy control circuit configured to generate a copy input control signal, which is enabled according to the input control signal when the flag signal is enabled, and configured to generate a copy output control signal, which is enabled according to an inverted output control signal when the write copy signal is enabled; and a pipe circuit configured to latch the data when the input control signal is inputted to the pipe circuit, configured to output the latched data as the internal data when the output control signal is inputted to the pipe circuit, configured to store the data as the pattern data when the copy input control signal is inputted to the pipe circuit, and configured to output the pattern data as the internal data when the copy output control signal is inputted to the pipe circuit.

6. The semiconductor system of claim 5, wherein the command decoder comprises:
   a write signal generation circuit configured to be synchronized with a clock signal to generate the write signal, which is enabled when the chip selection signal is enabled and the command signal has a first logic level combination;
   a flag signal generation circuit configured to be synchronized with the clock signal to generate the flag signal, which is enabled when the chip selection signal is enabled and the command signal has a second logic level combination; and
   a write copy signal generation circuit configured to be synchronized with the clock signal to generate the write copy signal, which is enabled when the chip selection signal is enabled and the command signal has a third logic level combination.

7. The semiconductor system of claim 5, wherein the pipe control circuit comprises:
   an internal clock generation circuit configured to generate an internal clock signal that is toggled in synchronization with a clock signal when the write signal is inputted to the internal clock generation circuit;
   an input control signal generation circuit configured to delay the write signal by a first predetermined period in synchronization with the internal clock signal to generate the input control signal; and
   an output control signal generation circuit configured to delay the write signal by a second predetermined period in synchronization with the internal clock signal to generate the output control signal,
   wherein the output control signal is disabled when the write copy signal is inputted to the output control signal generation circuit.

8. The semiconductor system of claim 5, wherein the pipe circuit comprises:
   the first latch circuit configured to latch the data as the latched data when the input control signal is inputted to the first latch circuit and configured to output the latched data as the internal data when the output control signal is inputted to the first latch circuit; and
   the second latch circuit configured to latch the data as the pattern data when the copy input control signal is inputted to the second latch circuit and configured to output the pattern data as the internal data when the copy output control signal is inputted to the second latch circuit.

9. A semiconductor system comprising:
a first semiconductor device configured to output a chip selection signal, a command signal, first data, and second data; and
a second semiconductor device comprising:
   a first latch circuit configured to:
      receive, when the chip selection signal is enabled and a write operation is performed according to a first logic level combination of the command signal, the first data;
      latch, when the write operation is performed, the first data as first latched data; and
      output, when the write operation is performed, the first latched data as first internal data to be stored by the second semiconductor device;
   a second latch circuit configured to:
      receive, when the write operation is performed, the first data;
      latch, when the write operation is performed, the first data as first pattern data; and
      output, when the chip selection signal is enabled and a write copy operation is performed according to a second logic level combination of the command signal, the first pattern data as the first internal data to be stored by the second semiconductor device without the second semiconductor device receiving the first data, wherein the write copy operation is performed after the write operation is performed;
   a third latch circuit configured to:
      receive, when the write operation is performed, second data;
      latch, when the write operation is performed, the second data as second latched data; and
      output, when the write operation is performed, the second latched data as second internal data to be stored by the second semiconductor device; and
   a fourth latch circuit configured to:
      receive, when the write operation is performed, the second data;
      latch, when the write operation is performed, the second data as second pattern data; and
      output, when the write copy operation is performed, the second pattern data as the second internal data to be stored by the semiconductor device without the second semiconductor device receiving the second data.

10. The semiconductor system of claim 9, wherein the second semiconductor device comprises:
   a first data processing circuit comprising the first and second latch circuits;
   a second data processing circuit comprising the third and fourth latch circuits; and
   a core region comprising a plurality of bank groups, wherein the first and second internal data is stored in one of the bank groups, which is selected according to an address signal.

11. The semiconductor system of claim 10, wherein the first data processing circuit comprises:
   a first command decoder configured to decode the command signal to generate a first write signal, to decode the command signal to generate a first flag signal, and to decode the command signal to generate a first write copy signal, when the chip selection signal is enabled;
   a first pipe control circuit configured to generate a first input control signal and a first output control signal, which are sequentially enabled when the first write signal is enabled, wherein the first output control signal is disabled when the first write copy signal is enabled;
   a first copy control circuit configured to generate a first copy input control signal, which is enabled according to the first input control signal when the first flag signal is enabled, and configured to generate a first copy output control signal which is enabled according to a first inverted output control signal when the first write copy signal is enabled; and a first pipe circuit comprising the first and second latch circuits, wherein the first pipe circuit is configured to latch the first data when the first input control signal is inputted to the first pipe circuit, configured to output the latched first data as the first internal data when the first output control signal is inputted to the first pipe circuit, configured to store the first data as the first pattern data when the first copy input control signal is inputted to the first pipe circuit, and configured to output the first pattern data as the first internal data when the first copy output control signal is inputted to the first pipe circuit.

12. The semiconductor system of claim 11, wherein the first command decoder comprises:
   a first write signal generation circuit configured to be synchronized with a clock signal to generate the first write signal, which is enabled when the chip selection signal is enabled and the command signal has the first logic level combination;
   a first flag signal generation circuit configured to be synchronized with the clock signal to generate the first flag signal, which is enabled when the chip selection signal is enabled and the command signal has a third logic level combination; and
   a first write copy signal generation circuit configured to be synchronized with the clock signal to generate the first write copy signal, which is enabled when the chip selection signal is enabled and the command signal has the second_logic level combination.

13. The semiconductor system of claim 11, wherein the first pipe control circuit comprises:
   a first internal clock generation circuit configured to generate a first internal clock signal that is toggled in synchronization with a clock signal when the first write signal is inputted to the first internal clock generation circuit;
   a first input control signal generation circuit configured to delay the first write signal by a first predetermined period in synchronization with the first internal clock signal to generate the first input control signal; and
   a first output control signal generation circuit configured to delay the first write signal by a second predetermined period in synchronization with the first internal clock signal to generate the first output control signal,
   wherein the first output control signal is disabled when the first write copy signal is inputted to the first output control signal generation circuit.

14. The semiconductor system of claim 11, wherein the first pipe circuit comprises:
   a first latch circuit configured to latch the first data as the first latched data when the first input control signal is inputted to the first latch circuit and configured to output the first latched data as the first internal data when the first output control signal is inputted to the first latch circuit; and
   a second latch circuit configured to latch the first data as the first pattern data when the first copy input control signal is inputted to the second latch circuit and configured to output the first pattern data as the first internal data when the first copy output control signal is inputted to the second latch circuit.

15. The semiconductor system of claim 10, wherein the second data processing circuit comprises:
   a second command decoder configured to decode the command signal to generate a second write signal, to decode the command signal to generate a second flag signal, and to decode the command signal to generate a second write copy signal, when the chip selection signal is enabled;
   a second pipe control circuit configured to generate a second input control signal and a second output control signal, which are sequentially enabled when the second write signal is enabled, wherein the second output control signal is disabled when the second write copy signal is enabled;
   a second copy control circuit configured to generate a second copy input control signal, which is enabled according to the second input control signal when the second flag signal is enabled, and configured to generate a second copy output control signal, which is enabled according to a second inverted output control signal when the second write copy signal is enabled; and
   a second pipe circuit comprising the third and fourth latch circuits, wherein the second pipe circuit is configured to latch the second data when the second input control signal is inputted to the second pipe circuit, configured to output the latched second data as the second internal data when the second output control signal is inputted to the second pipe circuit, configured to store the second data as the second pattern data when the second copy input control signal is inputted to the second pipe circuit, and configured to output the second pattern data as the second internal data when the second copy output control signal is inputted to the second pipe circuit.

16. The semiconductor system of claim 15, wherein the second command decoder comprises:
   a second write signal generation circuit configured to be synchronized with a clock signal to generate the second write signal, which is enabled when the chip selection signal is enabled and the command signal has the first logic level combination;
   a second flag signal generation circuit configured to be synchronized with the clock signal to generate the second flag signal, which is enabled when the chip selection signal is enabled and the command signal has a third logic level combination; and
   a second write copy signal generation circuit configured to be synchronized with the clock signal to generate the second write copy signal, which is enabled when the chip selection signal is enabled and the command signal has the second logic level combination.

17. The semiconductor system of claim 15, wherein the second pipe control circuit comprises:
   a second internal clock generation circuit configured to generate a second internal clock signal that is toggled in synchronization with a clock signal when the second write signal is inputted to the second internal clock generation circuit;
   a second input control signal generation circuit configured to delay the second write signal by a first predetermined period in synchronization with the second internal clock signal to generate the second input control signal; and
   a second output control signal generation circuit configured to delay the second write signal by a second predetermined period in synchronization with the second internal clock signal to generate the second output control signal,
   wherein the second output control signal is disabled when the second write copy signal is inputted to the second output control signal generation circuit.

18. The semiconductor system of claim 15, wherein the second pipe circuit comprises:
- a third latch circuit configured to latch the second data as the second latched data when the second input control signal is inputted to the third latch circuit and configured to output the second latched data as the second internal data when the second output control signal is inputted to the third latch circuit; and
- a fourth latch circuit configured to latch the second data as the second pattern data when the second copy input control signal is inputted to the fourth latch circuit and configured to output the second pattern data as the second internal data when the second copy output control signal is inputted to the fourth latch circuit.

19. A semiconductor device comprising:
a first data processing circuit comprising:
- a first latch circuit configured to:
  - receive, when a chip selection signal is enabled and a write operation is performed according to a first logic level combination of a command signal, first data;
  - latch, when the write operation is performed, the first data as first latched data; and
  - output, when the write operation is performed, the first latched data as first internal data to be stored by the semiconductor device; and
- a second latch circuit configured to:
  - receive, when the write operation is performed, the first data;
  - latch, when the write operation is performed, the first data as first pattern data; and
  - output, when the chip selection signal is enabled and a write copy operation is performed according to a second logic level combination of the command signal, the first pattern data as the first internal data to be stored by the semiconductor device without the semiconductor device receiving the first data, wherein the write copy operation is performed after the write operation is performed;

a second data processing circuit comprising:
- a third latch circuit configured to:
  - receive, when the write operation is performed, second data;
  - latch, when the write operation is performed, the second data as second latched data; and
  - output, when the write operation is performed, the second latched data as second internal data to be stored by the semiconductor device; and
- a fourth latch circuit configured to:
  - receive, when the write operation is performed, the second data;
  - latch, when the write operation is performed, the second data as second pattern data; and
  - output, when the write copy operation is performed, the second pattern data as the second internal data to be stored by the semiconductor device without the semiconductor device receiving the second data; and a core region configured to store the first and second internal data according to an address signal.

20. The semiconductor device of claim 19, further comprising at least one pipe circuit, wherein the first and second data is stored in the at least one pipe circuit as the first and second pattern data during the write operation, and wherein the first and second internal data is stored in the core region during the write copy operation.

21. The semiconductor device of claim 19, wherein the first data processing circuit comprises:
- a first command decoder configured to decode the command signal to generate a first write signal, to decode the command signal to generate a first flag signal, and to decode the command signal to generate a first write copy signal, when the chip selection signal is enabled;
- a first pipe control circuit configured to generate a first input control signal and a first output control signal, which are sequentially enabled when the first write signal is enabled, wherein the first output control signal is disabled when the first write copy signal is enabled;
- a first copy control circuit configured to generate a first copy input control signal, which is enabled according to the first input control signal when the first flag signal is enabled, and configured to generate a first copy output control signal, which is enabled according to a first inverted output control signal when the first write copy signal is enabled; and
- a first pipe circuit comprising the first and second latch circuit, wherein the first pipe circuit is configured to latch the first data when the first input control signal is inputted to the first pipe circuit, configured to output the latched first data as the first internal data when the first output control signal is inputted to the first pipe circuit, configured to store the first data as the first pattern data when the first copy input control signal is inputted to the first pipe circuit, and configured to output the first pattern data as the first internal data when the first copy output control signal is inputted to the first pipe circuit.

22. The semiconductor device of claim 21, wherein the first command decoder comprises:
- a first write signal generation circuit configured to be synchronized with a clock signal to generate the first write signal which is enabled when the chip selection signal is enabled and the command signal has the first logic level combination;
- a first flag signal generation circuit configured to be synchronized with the clock signal to generate the first flag signal which is enabled when the chip selection signal is enabled and the command signal has a third logic level combination; and
- a first write copy signal generation circuit configured to be synchronized with the clock signal to generate the first write copy signal which is enabled when the chip selection signal is enabled and the command signal has the second logic level combination.

23. The semiconductor device of claim 21, wherein the first pipe control circuit comprises:
- a first internal clock generation circuit configured to generate a first internal clock signal that is toggled in synchronization with a clock signal when the first write signal is inputted to the first internal clock generation circuit;
- a first input control signal generation circuit configured to delay the first write signal by a first predetermined period in synchronization with the first internal clock signal to generate the first input control signal; and
- a first output control signal generation circuit configured to delay the first write signal by a second predetermined period in synchronization with the first internal clock signal to generate the first output control signal,
- wherein the first output control signal is disabled when the first write copy signal is inputted to the first output control signal generation circuit.

24. The semiconductor device of claim 21, wherein:
the first latch circuit is configured to latch the first data as the first latched data when the first input control signal is inputted to the first latch circuit and configured to output the first latched data as the first internal data when the first output control signal is inputted to the first latch circuit; and
the second latch circuit is configured to latch the first data as the first pattern data when the first copy input control signal is inputted to the second latch circuit and configured to output the first pattern data as the first internal data when the first copy output control signal is inputted to the second latch circuit.

25. The semiconductor device of claim 19, wherein the second data processing circuit comprises:
a second command decoder configured to decode the command signal to generate a second write signal, to decode the command signal to generate a second flag signal, and to decode the command signal to generate a second write copy signal, when the chip selection signal is enabled;
a second pipe control circuit configured to generate a second input control signal and a second output control signal, which are sequentially enabled when the second write signal is enabled, wherein the second output control signal is disabled when the second write copy signal is enabled;
a second copy control circuit configured to generate a second copy input control signal, which is enabled according to the second input control signal when the second flag signal is enabled, and configured to generate a second copy output control signal, which is enabled according to a second inverted output control signal when the second write copy signal is enabled; and
a second pipe circuit comprising the third and fourth latch circuits, wherein the second pipe circuit is configured to latch the second data when the second input control signal is inputted to the second pipe circuit, configured to output the latched second data as the second internal data when the second output control signal is inputted to the second pipe circuit, configured to store the second data as the second pattern data when the second copy input control signal is inputted to the second pipe circuit, and configured to output the second pattern data as the second internal data when the second copy output control signal is inputted to the second pipe circuit.

26. The semiconductor device of claim 25, wherein the second command decoder comprises:

a second write signal generation circuit configured to be synchronized with a clock signal to generate the second write signal, which is enabled when the chip selection signal is enabled and the command signal has the first logic level combination;
a second flag signal generation circuit configured to be synchronized with the clock signal to generate the second flag signal, which is enabled when the chip selection signal is enabled and the command signal has a third logic level combination; and
a second write copy signal generation circuit configured to be synchronized with the clock signal to generate the second write copy signal, which is enabled when the chip selection signal is enabled and the command signal has the second logic level combination.

27. The semiconductor device of claim 25, wherein the second pipe control circuit comprises:
a second internal clock generation circuit configured to generate a second internal clock signal that is toggled in synchronization with a clock signal when the second write signal is inputted to the second internal clock generation circuit;
a second input control signal generation circuit configured to delay the second write signal by a first predetermined period in synchronization with the second internal clock signal to generate the second input control signal; and
a second output control signal generation circuit configured to delay the second write signal by a second predetermined period in synchronization with the second internal clock signal to generate the second output control signal,
wherein the second output control signal is disabled when the second write copy signal is inputted to the second output control signal generation circuit.

28. The semiconductor device of claim 25, wherein:
the third latch circuit is configured to latch the second data as the second latched data when the second input control signal is inputted to the third latch circuit and configured to output the second latched data as the second internal data when the second output control signal is inputted to the third latch circuit; and
the fourth latch circuit is configured to latch the second data as the second pattern data when the second copy input control signal is inputted to the fourth latch circuit and configured to output the second pattern data as the second internal data when the second copy output control signal is inputted to the fourth latch circuit.

* * * * *